United States Patent
Yatskov et al.

(10) Patent No.: US 11,076,502 B1
(45) Date of Patent: *Jul. 27, 2021

(54) APPARATUS, SYSTEM, AND METHOD FOR COOLING MULTI-CHIP MODULES VIA CLUSTERED FLUID-COOLED PLATES

(71) Applicant: Juniper Networks, Inc., Sunnyvale, CA (US)

(72) Inventors: Alexander I. Yatskov, Manteca, CA (US); Stephen Cleeton, Morgan Hill, CA (US); Valery Kugel, Mountain View, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/734,320

(22) Filed: Jan. 4, 2020

Related U.S. Application Data

(63) Continuation of application No. 16/221,229, filed on Dec. 14, 2018, now Pat. No. 10,575,438.

(51) Int. Cl.
| | | |
|---|---|---|
| *H05K 7/20* | (2006.01) | |
| *H01L 23/473* | (2006.01) | |
| *H01L 23/40* | (2006.01) | |
| *H05K 1/02* | (2006.01) | |

(52) U.S. Cl.
CPC ....... *H05K 7/20254* (2013.01); *H01L 23/473* (2013.01); *H05K 7/20272* (2013.01); *H01L 23/4006* (2013.01); *H05K 1/0203* (2013.01)

(58) Field of Classification Search
CPC ............ H05K 7/20254; H05K 7/20272; H01L 23/4006; H01L 23/473
USPC .......... 361/699, 702; 165/80.4–80.5, 104.33; 257/714, 719
See application file for complete search history.

(56) References Cited

U.S. PATENT DOCUMENTS

| | | |
|---|---|---|
| 4,748,495 A | 5/1988 | Kucharek |
| 4,791,983 A | 12/1988 | Nicol et al. |
| 5,329,419 A | 7/1994 | Umezawa |
| 6,915,653 B2 | 7/2005 | Nakano et al. |

(Continued)

OTHER PUBLICATIONS

Non-Final Office Action received for U.S. Appl. No. 16/221,229 dated Aug. 2, 2019, 32 pages.

(Continued)

*Primary Examiner* — Zachary Pape
(74) *Attorney, Agent, or Firm* — FisherBroyles, LLP

(57) ABSTRACT

The disclosed apparatus may include (1) a plurality of fluid-cooled plates that thermally couple to a plurality of electronic components included on a multi-chip module, (2) at least one source conduit that (A) is operatively coupled to at least one fluid-cooled plate within the plurality of fluid-cooled plates and (B) feeds cooling fluid from a condenser to the fluid-cooled plate, (3) at least one return conduit that (A) is operatively coupled to at least one additional fluid-cooled plate within the plurality of fluid-cooled plates and (B) returns the cooling fluid from the additional fluid-cooled plate toward the condenser, and (4) an assembly that (A) is mechanically coupled to the fluid-cooled plates and (B) reinforces the thermal couplings between the fluid-cooled plates and the electronic components included on the multi-chip module. Various other apparatuses, systems, and methods are also disclosed.

18 Claims, 12 Drawing Sheets

(56) References Cited

U.S. PATENT DOCUMENTS

| | | |
|---|---|---|
| 7,298,618 B2 | 11/2007 | Campbell et al. |
| 7,562,617 B2 | 7/2009 | Di Stefano et al. |
| 8,363,404 B2 * | 1/2013 | Colbert .................... G06F 1/20 |
| | | 361/702 |
| 8,363,413 B2 | 1/2013 | Paquette et al. |
| 9,265,176 B2 * | 2/2016 | Arvelo ................ H01L 21/4882 |
| 10,575,438 B1 * | 2/2020 | Yatskov ............. H05K 7/20272 |

OTHER PUBLICATIONS

Notice of Allowance received for U.S. Appl. No. 16/221,229 dated Oct. 24, 2019, 33 pages.

* cited by examiner

APPARATUS, SYSTEM, AND METHOD FOR COOLING MULTI-CHIP MODULES VIA CLUSTERED FLUID-COOLED PLATES

CROSS REFERENCE TO RELATED APPLICATION

This application is a continuation of U.S. application Ser. No. 16/221,229 filed 14 Dec. 2018, the disclosure of which is incorporated, in its entirety, by this reference.

BACKGROUND

Fluid-cooled plates (sometimes referred to as cold plates) are often used to meet the thermal demands of today's high-power electronics. In this context, fluid-cooled plates are a thermal management technology that involves a heat transfer interface cooled by a cold flowing fluid. While this cold flowing fluid potentially improves the heat transfer capabilities of the interface, traditional fluid-cooled plate technology may still suffer from certain deficiencies and/or shortcomings.

For example, traditional fluid-cooled plate technology may be too large and/or cumbersome to meet the size and/or design constraints of certain multi-chip modules with limited available space. In addition, traditional fluid-cooled plate technology may be unable to achieve sufficient thermal couplings with individual electronic components included on multi-chip modules that experienced too much warping during production and/or too much deflection at the socket joints. As a result of such warping, the electronic components included on the multi-chip modules may be too non-coplanar with one another for the traditional fluid-cooled plate technology to work properly. In particular, the non-coplanarity of such electronic components may prevent the traditional fluid-cooled plate technology from applying appropriate loads to the electronic components within an acceptable tolerance range.

The instant disclosure, therefore, identifies and addresses a need for additional and improved apparatuses, systems, and methods for cooling multi-chip modules via clustered fluid-cooled plates.

SUMMARY

As will be described in greater detail below, the instant disclosure generally relates to apparatuses, systems, and methods for cooling multi-chip modules via clustered fluid-cooled plates. In one example, an apparatus for accomplishing such a task may include (1) a plurality of fluid-cooled plates that thermally couple to a plurality of electronic components included on a multi-chip module, (2) at least one source conduit that (A) is operatively coupled to at least one fluid-cooled plate within the plurality of fluid-cooled plates and (B) feeds cooling fluid from a condenser to the fluid-cooled plate, (3) at least one return conduit that (A) is operatively coupled to at least one additional fluid-cooled plate within the plurality of fluid-cooled plates and (B) returns the cooling fluid from the additional fluid-cooled plate toward the condenser, and (4) an assembly that (A) is mechanically coupled to the fluid-cooled plates and (B) reinforces the thermal couplings between the fluid-cooled plates and the electronic components included on the multi-chip module.

Similarly, a system for accomplishing such a task may include (1) a multi-chip module that includes a plurality of electronic components, (2) a plurality of fluid-cooled plates that thermally couple to the electronic components included on the multi-chip module, (3) at least one source conduit that (A) is operatively coupled to at least one fluid-cooled plate within the plurality of fluid-cooled plates and (B) feeds cooling fluid from a condenser to the fluid-cooled plate, (3) at least one return conduit that (A) is operatively coupled to at least one additional fluid-cooled plate within the plurality of fluid-cooled plates and (B) returns the cooling fluid from the additional fluid-cooled plate toward the condenser, and (4) an assembly that (A) is mechanically coupled to the fluid-cooled plates and (B) reinforces the thermal couplings between the fluid-cooled plates and the electronic components included on the multi-chip module.

A corresponding method may include (1) thermally coupling a plurality of fluid-cooled plates to a plurality of electronic components included on a multi-chip module, (2) operatively coupling at least one source conduit to at least one fluid-cooled plate within the plurality of fluid-cooled plates to facilitate feeding cooling fluid from a condenser to the fluid-cooled plate, (3) operatively coupling at least one return conduit to at least one additional fluid-cooled plate within the plurality of fluid-cooled plates to facilitate returning the cooling fluid from the additional fluid-cooled plate toward the condenser, and then (4) mechanically coupling, to the fluid-cooled plates, an assembly that reinforces the thermal couplings between the fluid-cooled plates and the electronic components included on the multi-chip module.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
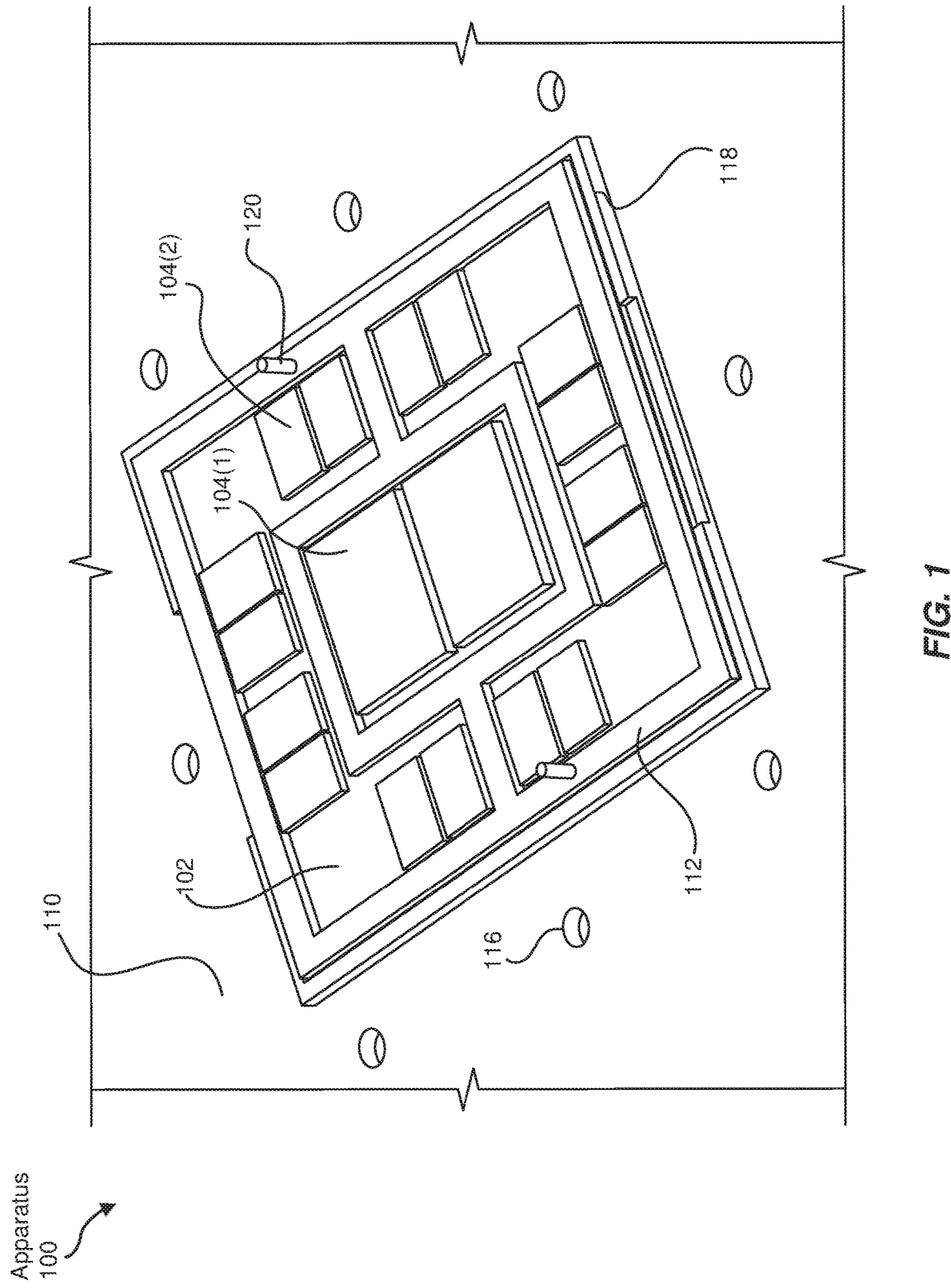
FIG. 1 is an illustration of an exemplary multi-chip module.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for cooling multi-chip modules via clustered fluid-cooled plates. As will be explained in greater detail below, the apparatuses, systems, and methods described herein may provide various advantages and/or benefits over traditional fluid-cooled plate technology. For example, embodiments of the instant disclosure may enable individual fluid-cooled plates to satisfy the size and/or design constraints of small-scale multi-chip modules even when only limited space is available. Accordingly, embodiments of the instant disclosure may reduce the size requirements of fluid-cooled plate designs and/or enable such designs to fit within smaller, tighter spaces. By doing so, these embodiments may help reduce the overall size and/or spatial impact or requirements of electronic components and/or computing devices that implement cold plate technology.

Additionally or alternatively, embodiments of the instant disclosure may enable fluid-cooled plates to achieve and/or maintain separate thermal couplings and/or contact with individual electronic components included on multi-chip modules even when those multi-chip modules experienced a certain degree of warping during production and/or deflection at the socket joints. Accordingly, embodiments of the instant disclosure may improve fluid-cooled plate technology such that even multi-chip modules whose electronic components are non-coplanar with one another (due, e.g., to warpage and/or deflection) are still candidates for heat transfer via fluid-cooled plates. Moreover, embodiments of the instant disclosure may implement spring-loaded assemblies that apply appropriate loads to fluid-cooled plates within an acceptable tolerance range such that the fluid-cooled plates maintain sufficient thermal contact with electronic components included on multi-chip modules.

The following will provide, with reference to FIG. 1, detailed descriptions of an exemplary multi-chip module. Detailed descriptions of exemplary apparatuses, systems, and implementations for cooling multi-chip modules via clustered fluid-cooled plates will be provided in connection with FIGS. 2-11. In addition, the discussion corresponding to FIG. 12 will provide a detailed description of an exemplary method for cooling multi-chip modules via clustered fluid-cooled plates.

FIG. 1 illustrates an exemplary apparatus 100 that includes a multi-chip module 102. Multi-chip module 102 generally represents any type or form of mechanical and/or electronic device containing a plurality of heat-generating electronic components. In some examples, multi-chip module 102 may include and/or represent an electronic device and/or assembly that contains various distinct chips, integrated circuits, and/or semiconductor dies. In one example, multi-chip module 102 may represent and/or be packaged as a lidless integrated circuit or device.

As illustrated in FIG. 1, exemplary multi-chip module 102 may include a plurality of electronic components, such as electronic components 104(1) and 104(2). In some examples, these electronic components may operate independently of each other. In other examples, these electronic components may operate in conjunction with one another.

These electronic components may each be secured to a platform of multi-chip module 102. Examples of such a platform include, without limitation, circuit boards (e.g., printed circuit boards), semiconductor substrates, wafers, sockets, variations or combinations of one or more of the same, and/or any other suitable platform. In some examples, multi-chip module 102 may be mounted to a socket aboard the platform.

In one example, electronic component 104(1) may represent one type of semiconductor die (e.g., a high bandwidth memory chip), and electronic component 104(2) may represent a different type of semiconductor die (e.g., an application specific integrated circuit). In general, multi-chip module 102 may contain any number and/or any type of distinct heat-generating electronic components. Examples of electronic components 104(1) and 104(2) include, without limitation, Application Specific Integrated Circuits (ASICs), Systems on a Chip (SoCs), lidless integrated circuits, optical switches, photonics chips, microprocessors, microcontrollers, Central Processing Units (CPUs), Field-Programmable Gate Arrays (FPGAs), memory devices, High Bandwidth Memory (HBM), Random Access Memory (RAM), Read Only Memory (ROM), flash memory, caches, semiconductor dies, portions of one or more of the same, variations or combinations of one or more of the same, and/or any other suitable component.

In some examples, electronic components 104(1) and 104(2) may be designed to operate at or below certain operating temperatures. For example, the performance and/or reliability of one or more of electronic components 104(1) and 104(2) may be impaired as its operating temperature rises beyond a certain threshold temperature. Because electronic component 104(1) and electronic component 104(2) may contain different materials and/or perform different functions, the threshold operating temperature of electronic component 104(1) may differ from the threshold operating temperature of electronic component 104(2). As an example, electronic component 104(2) may have a threshold operating temperature of 120° C., while electronic component 104(1) may have a threshold operating temperature of 100° C. To ensure proper operation of multi-chip module 102, the temperature of each of electronic components 104(1) and 104(2) must be kept at or below their respective threshold temperatures.

Unfortunately, some of these electronic components may be of slightly different heights due to imperfections (such as warpage, deflections, and/or tolerances) in the manufacturing process. For example, some electronic components may extend farther from the platform than other electronic components. This height disparity and/or lack of coplanarity may be the result of manufacturing tolerances and/or the dimensions of the electronic components.

In some examples, multi-chip module 102 may be incorporated into a telecommunications device that facilitates communication among computing devices within a network and/or across networks. Examples of such telecommunications devices include, without limitation, routers (such as provider edge routers, hub routers, spoke routers, autonomous system boundary routers, and/or area border routers), switches, hubs, modems, bridges, repeaters, gateways, multiplexers, network adapters, network interfaces, network racks, chasses, servers, computing devices, portions of one or more of the same, combinations or variations of one or more of the same, and/or any other suitable telecommunications device.

As illustrated in FIG. 1, multichip module 102 may include and/or incorporate a stiffener 112 designed to mitigate warpage and/or deflection during manufacturing. In one example, stiffener 112 may include and/or form various segments and/or structures that make physical contact with the platform of multi-chip module 102. For example, stiffener 112 may include and/or form a brace that runs around the perimeter and/or border of multi-chip module 102. Additionally or alternatively, stiffener 112 may include and/or form a brace that runs around a central portion of multi-chip module 102.

Stiffener 112 may include and/or form any suitable shape. Examples of such shapes include, without limitation, squares, circles, ovals, portions of one or more of the same, combinations or variations of one or more of the same, and/or any other suitable materials. Stiffener 112 may include and/or contain any of a variety of materials. Examples of such materials include, without limitation, metals, plastics, ceramics, polymers, composites, combinations or variations of one or more of the same, and/or any other suitable materials.

In some examples, stiffener 112 may form a shape that covers most of the platform of multi-chip module 102. In such examples, the electronic components included on multi-chip module 102 may be exposed, but the platform may be mostly covered by stiffener 112. In one example, one or more brackets (not necessarily illustrated in FIG. 1) may be secured and/or coupled to multi-chip module 102 and/or stiffener 112 to retain multi-chip module 102 and/or stiffener 112 in place on a mounting socket.

As illustrated in FIG. 1, multi-chip module 102 may also include one or more alignment pins, such as alignment pin 120. These alignment pins generally represent any type or form of physical material, structure, and/or support feature that hold and/or align a base of a fluid-cooled plate assembly and/or enclosure in a specific position when placed atop a multi-chip module. In one example, these alignment pins may each include and/or represent physical member and/or peg capable of supporting and/or maintaining a fluid-cooled plate assembly and/or cluster in place on multi-chip module 102.

These alignment pins may each include and/or form any suitable shape. Examples of such shapes include, without limitation, squares, circles, ovals, cubes, cylinders, portions of one or more of the same, combinations or variations of one or more of the same, and/or any other suitable materials. In one example, these alignment pins may be incorporated into and/or formed by stiffener 112 in FIG. 1.

These alignment pins may each include and/or contain any of a variety of materials. Examples of such materials include, without limitation, metals, plastics, ceramics, polymers, composites, combinations or variations of one or more of the same, and/or any other suitable materials. In addition, these alignment pins may each be of any suitable dimensions.

As illustrated in FIG. 1, apparatus 100 may include a substrate 110 to which multi-chip module 102 is coupled mechanically and/or electrically. In some examples, multi-chip module 102 may be mounted to substrate 110 by way of a mounting socket 118 (such as a ball grid array socket). In one example, substrate 110 may include and/or represent a circuit board (e.g., a printed circuit board). Additional examples of substrate 110 include, without limitation, back plates that provide support to multi-chip modules, sockets for mounting multi-chip modules, stiffening braces that mitigate warpage of multi-chip modules, semiconductor materials, variations or combinations of one or more of the same, and/or any other suitable substrate.

As illustrated in FIG. 1, substrate 110 may include and/or form one or more mounting holes, such as mounting hole 116. In one example, these mounting holes may facilitate mounting a base of a fluid-cooled plate assembly and/or enclosure in a specific position atop multi-chip module 102. In this example, mounting screws may interface with and/or pass through substrate 110 via these mounting holes to secure the base of the fluid-cooled plate assembly and/or enclosure in place.

Figure 2:
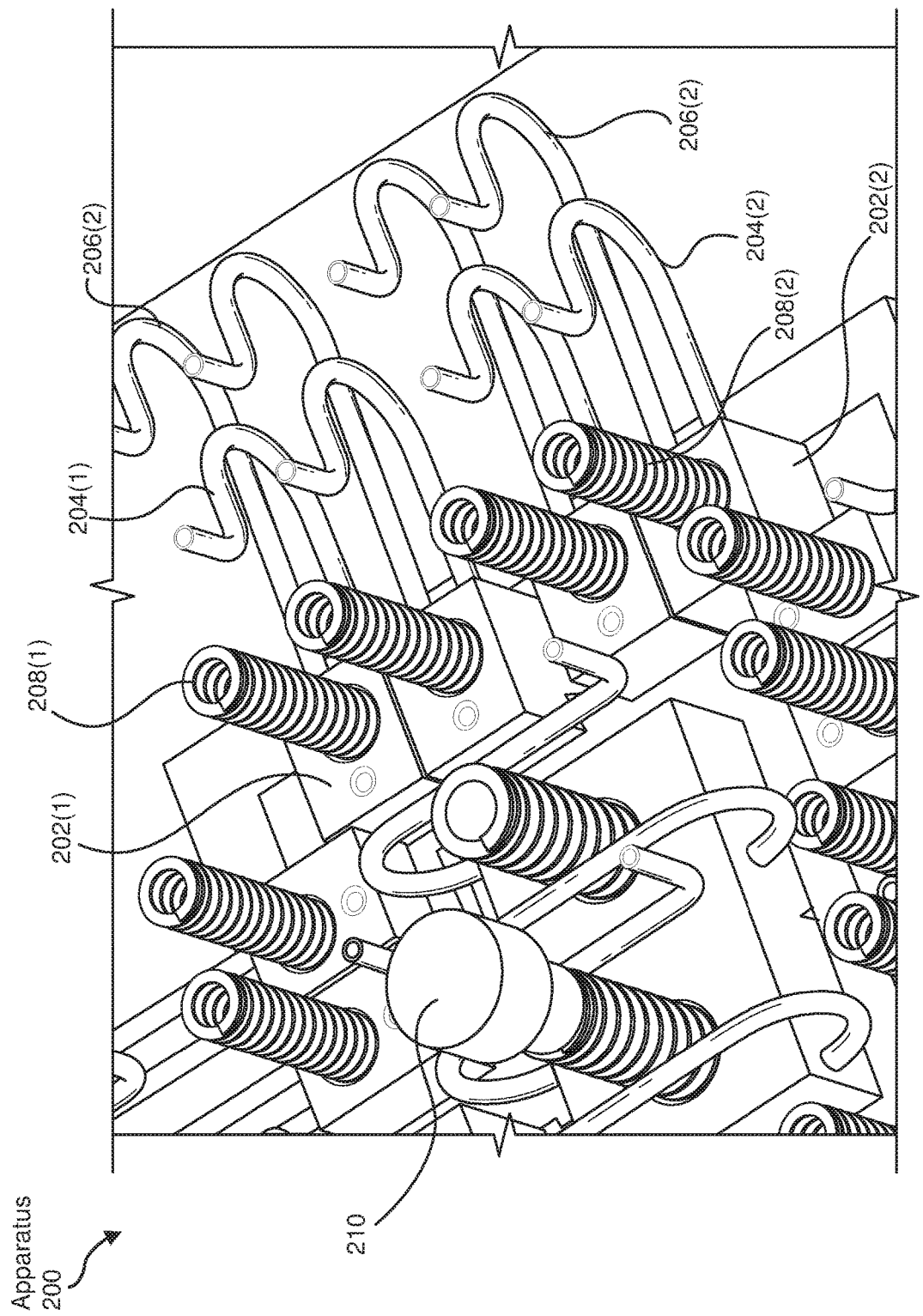
FIG. 2 is an illustration of an exemplary apparatus for cooling multi-chip modules via clustered fluid-cooled plates.

FIG. 2 illustrates an exemplary apparatus 200 for cooling multi-chip module 102 via clustered fluid-cooled plates, such as fluid-cooled plates 202(1) and 202(2). Fluid-cooled plates 202(1) and 202(2) generally represent any type or form of heat transfer interface that conducts, transfers, absorbs, and/or sinks heat and also cools itself by way of cooling fluid. In one example, fluid-cooled plates 202(1) and 202(2) may each make physical and/or thermal contact with an electronic component of multi-chip module 102 for the purpose of conducting, transferring, absorbing, and/or sinking heat generated by the electronic component. Accordingly, fluid-cooled plates 202(1) and 202(2) may effectively cool these electronic components of multi-chip module 102. In this example, while fluid-cooled plates 202(1) and 202(2) may cool these electronic components of multi-chip module 102, fluid-cooled plates 202(1) and 202(2) may also themselves be cooled by cooling fluid that flows through fluid-cooled plates 202(1) and 202(2), thus demonstrating and/or achieving a two-phase cooling functionality of cold plate technology.

In one example, some of these fluid-cooled plates may be physically and/or thermally separated or isolated from each other. Accordingly, these fluid-cooled plates may be individually placed atop their corresponding electronic components. The individual nature of these fluid-cooled plates may facilitate compensating for any non-coplanarity, warpage, deflection, and/or tolerances of multi-chip module 102.

These fluid-cooled plates may be of various shapes and/or dimensions. In some examples, these fluid-cooled plates may form a square and/or a rectangle. Additional examples of shapes formed by these fluid-cooled plates include, without limitation, ovals, circles, triangles, diamonds, parallelograms, combinations or variations of one or more of the same, and/or any other suitable shapes.

In some examples, these fluid-cooled plates may be sized in a particular way to maximize the amount of heat transferred from the component and/or fit within a certain space. In one example, fluid-cooled plate 202(1) may run the length of one side of the corresponding electronic component. Additionally or alternatively, fluid-cooled plate 202(1) may include and/or incorporate a Thermal Interface Material (TIM) (of, e.g., TIM2 thickness) that makes physical contact with the corresponding electronic component. Similarly, fluid-cooled plate 202(2) may include and/or incorporate a TIM that makes physical contact with the corresponding electronic component.

These fluid-cooled plates may include and/or contain a variety of thermally conductive materials. In one example, these fluid-cooled plates may be made of copper. Additional examples of such thermally conductive materials include, without limitation, aluminum, diamond, alloys, combinations or variations of one or more of the same, and/or any other suitable materials. In addition, one or more of these fluid-cooled plates may include a heatsink fin structure.

In some examples, the electronic components that span the perimeter of multi-chip module 102 may be substantially coplanar with one another. In such examples, the fluid-cooled plates that sit atop those electronic components spanning the perimeter may likewise be coplanar with one another.

In some examples, the electronic components located in the center of multi-chip module 102 may be substantially coplanar with one another. In such examples, the fluid-cooled plates that sit atop those electronic components located in the center may likewise be coplanar with one another.

However, in some examples, the electronic components spanning the perimeter and the electronic components located in the center may be non-coplanar with one another. For example, an electronic component located along the edge of multi-chip module 102 and an electronic component located in the center of multi-chip 102 may be non-coplanar with one another. As a result, the fluid-cooled plates that sit atop those electronic components may likewise be non-coplanar with one another.

As illustrated in FIG. 2, apparatus 200 may include one or more source conduits, such as source conduits 204(1) and 204(2). In some examples, these source conduits may each be operatively coupled to a fluid-cooled plate. For example, source conduit 204(1) may be operatively coupled to fluid-cooled plate 202(1). Additionally or alternatively, source conduit 204(2) may be operatively coupled to fluid-cooled plate 202(2). These source conduits in FIG. 2 may individually feed and/or carry cooling fluid arriving from a condenser (not illustrated in FIG. 2) to their corresponding fluid-cooled plates.

In some examples, one end of source conduit 204(1) may be operatively coupled to fluid-cooled plate 202(1), and the other end of source conduit 204(1) may be operatively coupled to a distributor manifold (not illustrated in FIG. 2). Similarly, one end of source conduit 204(2) may be operatively coupled to fluid-cooled plate 202(2), and the other end of source conduit 204(2) may be operatively coupled to the distributor manifold. Accordingly, as the cooling fluid arrives at the distributor manifold from the condenser, these source conduits may represent inlets and/or entries that facilitate the flow of cooling fluid from the distributor manifold to each individual fluid-cooled plate. In one example, this distributor manifold may be incorporated into an assembly and/or enclosure that surrounds the fluid-cooled plates to form a stand-alone unit atop multi-chip module 102.

As illustrated in FIG. 2, apparatus 200 may include one or more return conduits, such as return conduits 206(1) and 206(2). In some examples, these return conduits may each be operatively coupled to a fluid-cooled plate. For example, return conduit 206(1) may be operatively coupled to fluid-cooled plate 202(1). Additionally or alternatively, return conduit 206(2) may be operatively coupled to fluid-cooled plate 202(2). These return conduits in FIG. 2 may individually return and/or carry the cooling fluid from their corresponding fluid-cooled plates toward the condenser.

In some examples, one end of return conduit 206(1) may be operatively coupled to fluid-cooled plate 202(1), and the other end of return conduit 206(1) may be operatively coupled to the distributor manifold. Similarly, one end of return conduit 206(2) may be operatively coupled to fluid-cooled plate 202(2), and the other end of return conduit 206(2) may be operatively coupled to the distributor manifold. Accordingly, these return conduits may represent outlets and/or exits that facilitate the flow of cooling fluid from each individual fluid-cooled plate to the distributor manifold on the way back to the condenser.

As illustrated in FIG. 2, apparatus 200 may include and/or represent a manifold configuration of clustered fluid-cooled plates in which each one is equipped with a source conduit and a return conduit. These source and return conduits may be of various shapes and/or dimensions. In some examples, these source and return conduits may be sized in a particular way to maximize the flow of cooling fluid and/or fit within a certain space. These source and return conduits may include and/or contain a variety of somewhat malleable, flexible, and/or shapeable materials. In one example, these source and return conduits may be made of annealed copper. Additional examples of such malleable, flexible, and/or shapeable materials include, without limitation, aluminum, gold, lead, platinum, alloys, combinations or variations of one or more of the same, and/or any other suitable materials.

The cooling fluid may include and/or represent any type or form of fluid capable of cooling and/or reducing the operating temperature of a heat transfer interface. Examples of such cooling fluid include, without limitation, liquids, gases, plasmas, vapors, variations or combinations of one or more of the same. Virtually any liquid may serve as cooling fluid. For example, the cooling fluid may include and/or represent water. In another example, the cooling fluid may include and/or represent a liquid refrigerant.

As illustrated in FIG. 2, apparatus 200 may include one or more coil springs, such as coil springs 208(1) and 208(2). In some examples, these coil springs may each be placed vertically atop of a fluid-cooled plate. For example, coil spring 208(1) may be placed vertically atop fluid-cooled plate 202(1). Additionally or alternatively, coil spring 208(2) may be placed vertically atop fluid-cooled plate 202(2). These coil springs may be individually compressed against and/or apply forces on their corresponding fluid-cooled plates.

Coil springs 208(1) and 208(2) each generally represent any type or form of mechanical apparatus and/or device capable of storing, absorbing, and/or releasing energy or force by way of one or more coils. Examples of these coil springs include, without limitation, compression springs, tension springs, extension springs, torsion springs, constant-force springs, combinations or variations of one or more of the same, and/or any other suitable springs.

In some examples, these coil springs may provide the necessary compression and/or load for a spring-loaded clamping assembly and/or system that secures and/or reinforces the individual thermal couplings between the fluid-cooled plates and the electronic components included on multi-chip module 102. These coil springs may ensure that each individual fluid-cooled plate maintains sufficient thermal contact with its corresponding electronic component despite any non-coplanarity, warpage, deflection, and/or tolerances experienced by multi-chip module 102 during manufacturing. In addition, one or more coil springs may be applied to and/or pressed against stiffener 112 to supply loads directly to stiffener 112, thereby alleviating some of the stress and/or strain placed on substrate 110 and/or the electronics components included on multi-chip module 102.

These coil springs may be of various shapes and/or dimensions. In some examples, coil springs 208(1) and 208(2) may each have a circular cross section. In one example, these coil springs may each be sized in a particular way to fit within a receptacle and/or opening included in and/or formed by the corresponding fluid-cooled plate. Additionally or alternatively, these coil springs may each be sized in a particular way such that their coils envelop a pin and/or peg (not illustrated in FIG. 2) atop the corresponding fluid-cooled plate. These receptacles, openings, pins, and pegs may be designed to hold and/or maintain these coil springs in place atop their corresponding fluid-cooled plates despite certain movements, compression, and/or forces experienced by these coil springs.

These coil springs may include and/or contain a variety of materials. Examples of such materials include, without limitation, metals, copper, aluminum, alloys, plastics, combinations or variations of one or more of the same, and/or any other suitable materials.

As illustrated in FIG. 2, apparatus 200 may include one or more clamping screws, such as clamping screw 210. In some examples, these clamping screws may interface and/or mate with the coil springs. In such examples, these clamping screws may control and/or adjust the compression, force, and/or load applied by the coil springs onto their corresponding fluid-cooled plates. For example, by turning and/or rotating a clamping screw in one direction, the clamping screw may increase the compression, force, and/or load placed on the corresponding fluid-cooled plate by the coil spring. In contrast, by turning and/or rotating the clamping screw in the opposite direction, the clamping screw may decrease and/or reduce the compression, force, and/or load placed on the corresponding fluid-cooled plate by the coil spring.

In some examples, these clamping screws may include threads that intertwine and/or lock with the coils of the springs placed atop the fluid-cooled plates. In such examples, these threads may slide along the coils of the coil springs as the clamping screws are turned and/or rotated in one direction or another.

These clamping screws may be of various shapes and/or dimensions. In one example, these clamping screws may each be sized in a particular way to fit within the opening formed by the corresponding coil spring. Additionally or alternatively, these clamping screws may each be sized in a particular way such that their threads fit within the corresponding clamping holes included in and/or formed by the assembly and/or enclosure for the fluid-cooled plates.

These coil springs may include and/or contain a variety of materials. Examples of such materials include, without limitation, metals, copper, aluminum, alloys, plastics, combinations or variations of one or more of the same, and/or any other suitable materials.

Although not necessarily illustrated in this way in FIG. 2, apparatus 200 may include an assembly and/or enclosure that assembles and/or clusters the fluid-cooled plates and other components together in a single unit. For example, the assembly and/or enclosure may include a base that mounts and/or couples to substrate 110. In this example, the assembly and/or enclosure may include a cover and/or head that interfaces with the base. The distributor manifold may be incorporated into this cover and/or head. Additionally or alternatively, the heads of the clamping screws in FIG. 2 may interface with and/or abut this cover and/or head.

Accordingly, FIG. 2 may represent a close-up, top-down view of apparatus 200 in which the cover and/or head of the corresponding assembly and/or enclosure is transparent, invisible, and/or missing. This view of apparatus 200 is merely exemplary and meant to illustrate the inner-workings and/or structure of apparatus 200 without obstruction by the cover and/or head of the corresponding assembly and/or enclosure.

Figure 3:
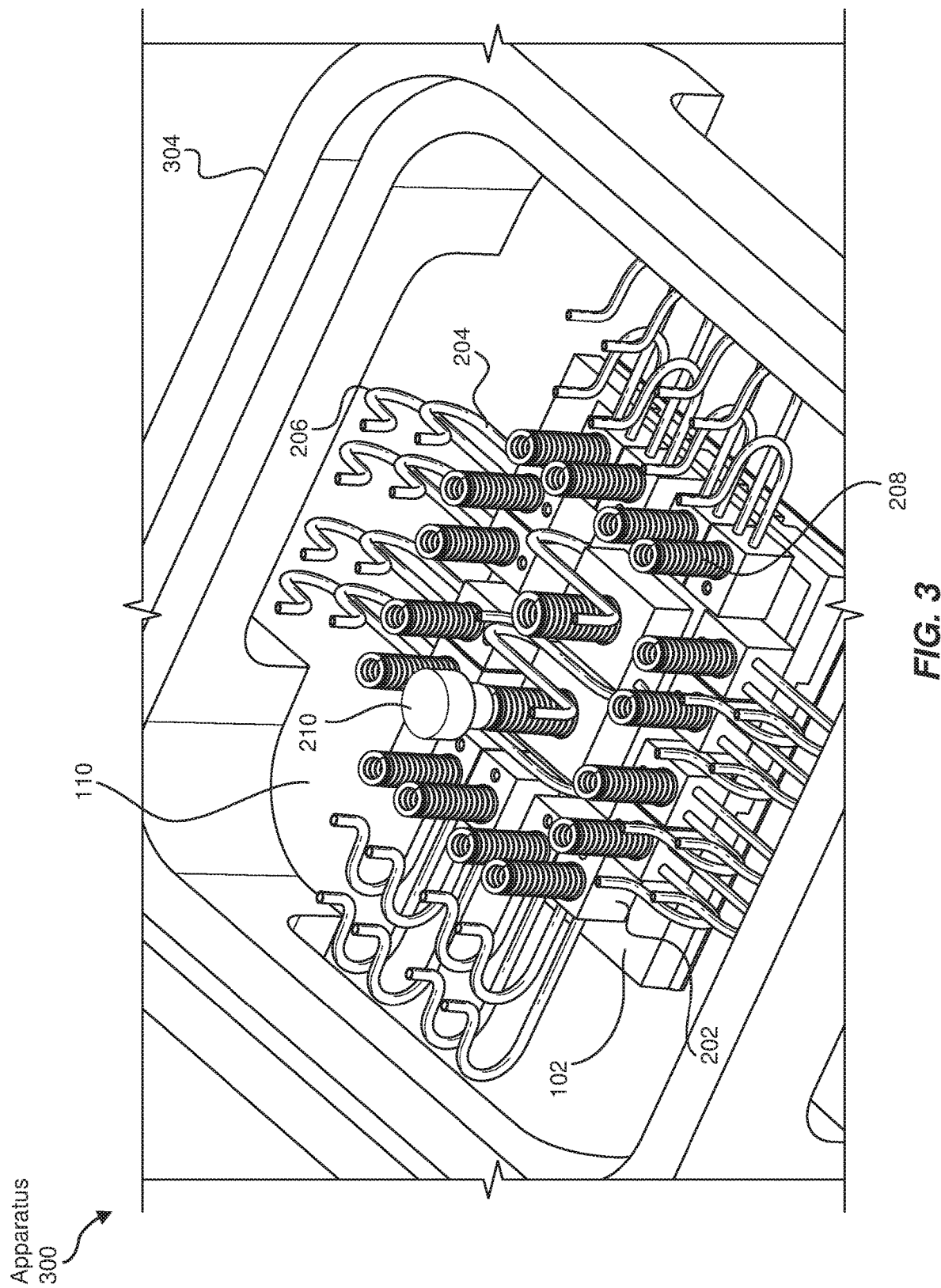
FIG. 3 is an illustration of an additional exemplary apparatus for cooling multi-chip modules via clustered fluid-cooled plates.
Figure 4:
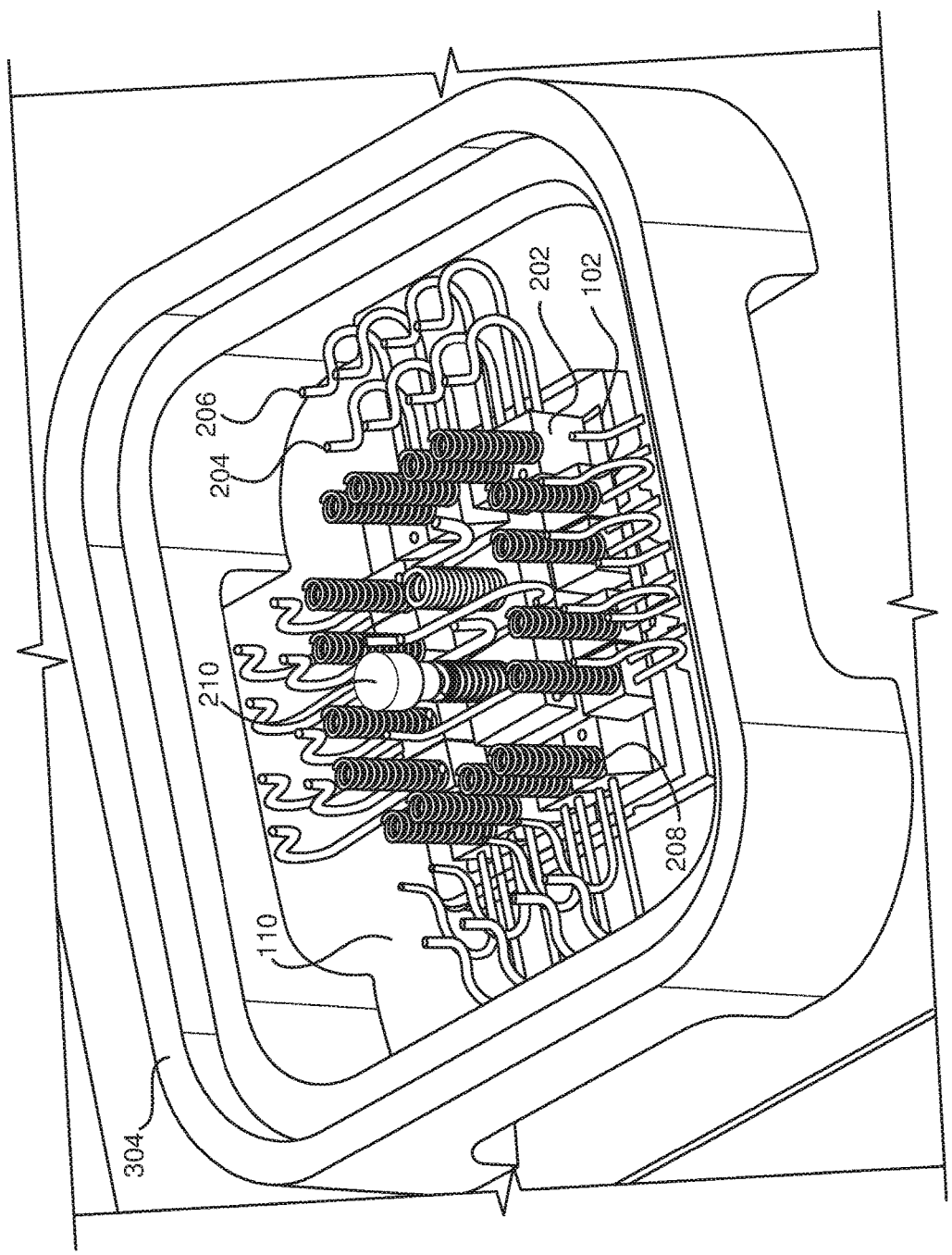
FIG. 4 is an illustration of an additional exemplary apparatus for cooling multi-chip modules via clustered fluid-cooled plates.

FIGS. 3 and 4 illustrate exemplary apparatuses 300 and 400, respectively, for cooling multi-chip module 102 via fluid-cooled plates clustered within an assembly. In one example, the assembly in which the fluid-cooled plates are clustered may include a base 304 in FIGS. 3 and 4. In this example, base 304 may be mechanically coupled to substrate 110 via one or more mounting screws (not necessarily illustrated in FIG. 3 or 4). These mounting screws may secure base 304 of the assembly to substrate 110 to ensure that the inner-workings and/or structure remain intact atop multi-chip 102.

These mounting screws may serve different purposes than the clamping screws that interface and/or mate with the coil springs. In particular, the mounting screws may couple and/or secure the assembly and substrate 110 together and/or in place relative to one another, and the clamping screws may control and/or adjust the compression, force, and/or load applied by the coil springs onto their corresponding fluid-cooled plates.

Figure 5:
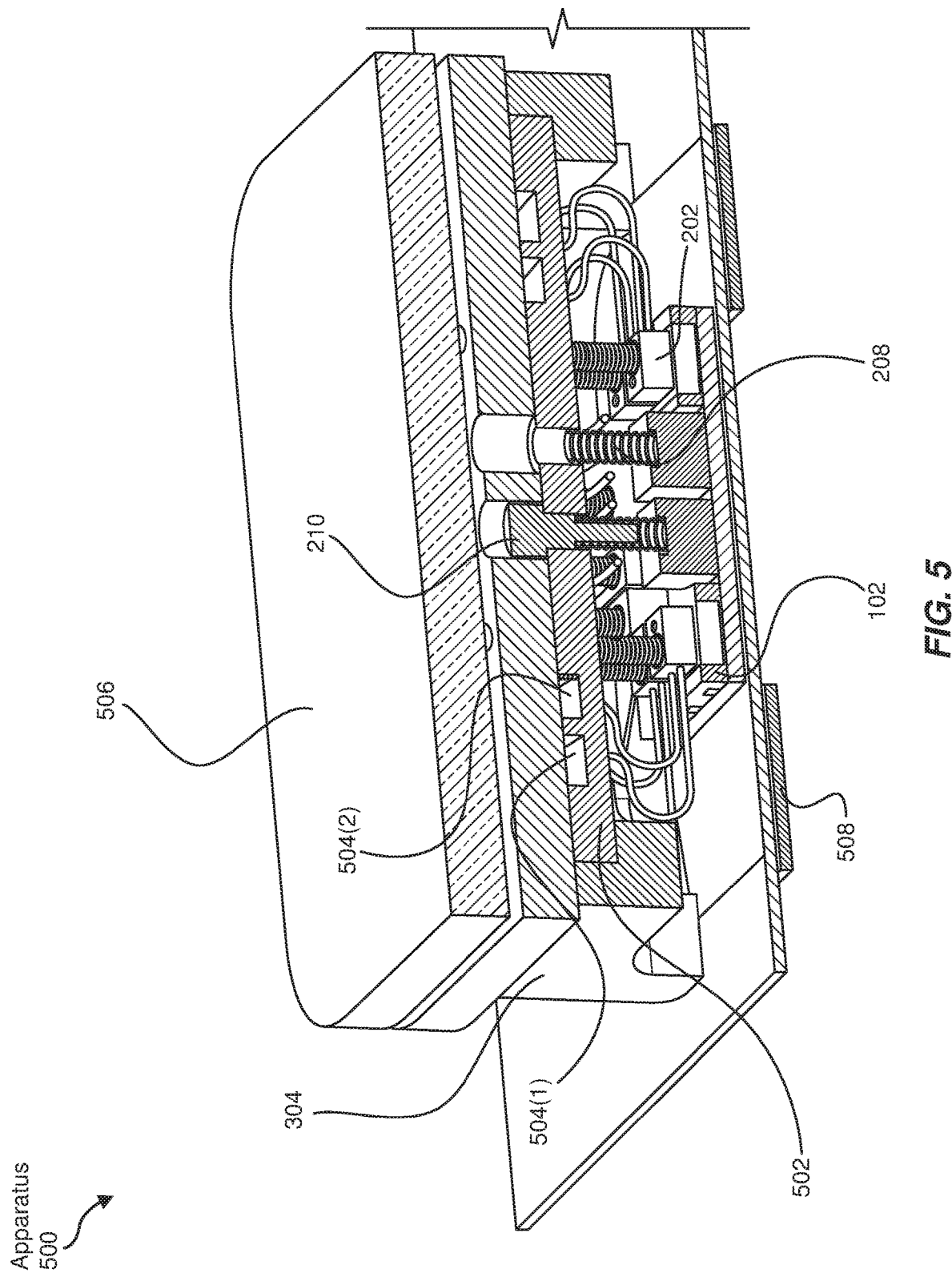
FIG. 5 is a cross-section illustration of an additional exemplary apparatus for cooling multi-chip modules via clustered fluid-cooled plates.

FIG. 5 illustrates a cross section of an exemplary apparatus 500 for cooling multi-chip module 102 via clustered fluid-cooled plates. As illustrated in FIG. 5, apparatus 500 may include an assembly in which the fluid-cooled plates are clustered. This assembly may fully or partially enclose the cluster of fluid-cooled plates and other components within a single unit. In one example, this assembly may include and/or consist of base 304 and/or a head 506 in FIG. 5. In this example, base 304 and/or head 506 may mate with and/or attach to one another. In some examples, base 304 and head 506 may represent and/or amount to distinct, separable parts of the assembly.

In addition, base 304 and/or head 506 may be secured and/or mechanically coupled to a back plate 508 that provides support and/or additional structure to multi-chip module 102 and/or the assembly. In one example, base 304 and/or head 506 may be applied to a top side of substrate 110 along with multi-chip module 102, and back plate 508 may be applied to a bottom side of substrate 110. In this example, back plate 508 may be attached to base 304 by way of mounting screws inserted via mounting holes included in substrate 110 from the bottom side of substrate 110.

As illustrated in FIG. 5, this assembly may also include and/or incorporate a distributor manifold 502 that is operatively coupled to each of the various source and/or return conduits. In addition, distributor manifold 502 may also be operatively coupled to a condenser and/or a pump (not illustrated in FIG. 5) that pushes and/or pumps the cooling fluid in a loop. In some examples, like base 304 and head 506, distributor manifold 502 may represent and/or amount to distinct, separable parts of the assembly. In other examples, distributor manifold 502 may be inseparably integrated into head 506 of the assembly.

In one example, distributor manifold 502 may receive the cooling fluid from the condenser and/or pump. In this example, distributor manifold 502 may then distribute and/or deliver the cooling fluid to the various fluid-cooled plates by way of the various source conduits. As the cooling fluid passes through the fluid-cooled plates, the cooling fluid may effectively cool and/or decrease the operating temperatures of the fluid-cooled plates, thereby potentially improving the performance and/or reliability of the corresponding electronic components included on multi-chip module 102.

As illustrated in FIG. 5, distributor manifold 502 may include and/or form one or more channels, such as channels 504(1) and 504(2). In one example, these channels may steer the flow of cooling fluid throughout distributor manifold 502. For example, channel 504(1) may steer the flow of incoming cooling fluid toward the source conduits. In this example, channel 504(2) may steer the flow of outgoing cooling fluid toward the condenser and/or pump.

Accordingly, distributor manifold 502 may channel the cooling fluid from the condenser and/or pump to the fluid-cooled plates via the individual source conduits. Distributor manifold 502 may also collect the cooling fluid from the fluid-cooled plates via the individual return conduits. Distributor manifold 502 may then channel the cooling fluid collected via the individual return conduits back toward the condenser and/or pump.

In some examples, when mechanically coupled to substrate 110, the assembly may compress one or more of the coil springs against the corresponding fluid-cooled plates to reinforce the thermal couplings between those fluid-cooled plates and their respective electronic components. Additionally or alternatively, one or more clamping screws may abut the coil springs, thereby compressing the coil springs. As a result, those clamping screws may provide a certain amount of resistance to the coil springs. Such resistance may cause the coil springs to apply force to the corresponding fluid-cooled plates, thereby reinforcing the thermal couplings between those fluid-cooled plates and their respective electronic components.

Figure 6:
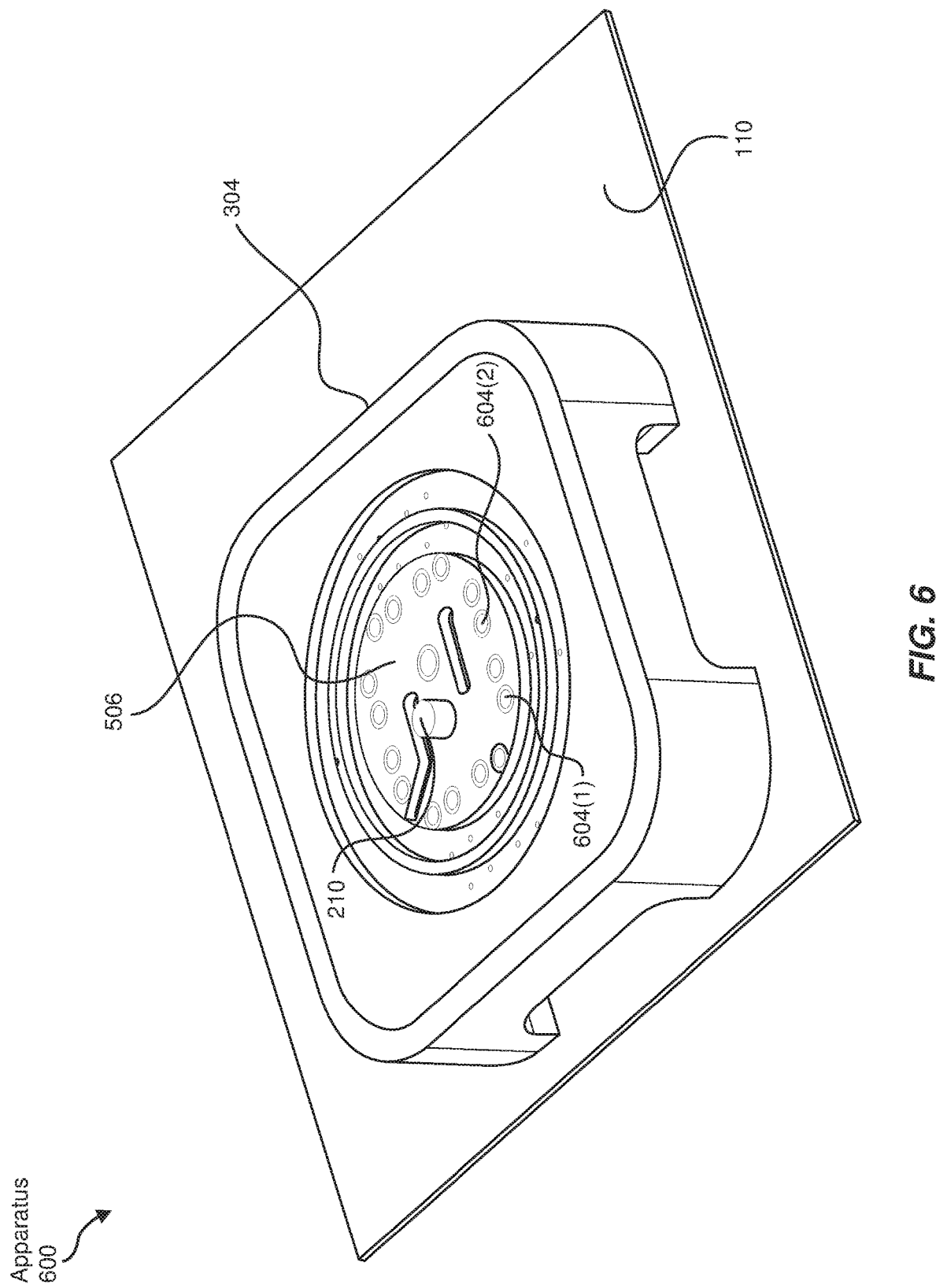
FIG. 6 is an illustration of an additional exemplary apparatus for cooling multi-chip modules via clustered fluid-cooled plates.

FIG. 6 illustrates an exemplary apparatus 600 for cooling multi-chip module 102 via clustered fluid-cooled plates. As illustrated in FIG. 6, apparatus 600 may include and/or represent an enclosed assembly consisting of base 304 and/or head 506. In one example, head 506 may include one or more clamping holes, such as clamping holes 604(1) and 604(2). These clamping holes may facilitate the insertion and/or rotation of the clamping screws that control and/or adjust the compression, force, and/or load applied by the coil springs. In this example, the threads of the compression screws may mate and/or interface with the corresponding coil springs inside the assembly. Additionally or alternatively, the heads of the clamping screws may abut and/or rest on the outer surface of head 506.

In one example, the assembly in which the fluid-cooled plates are clustered may include a base 304 in FIGS. 3 and 4. In this example, base 304 may be mechanically coupled to substrate 110 via one or more mounting screws (not necessarily illustrated in FIG. 3 or 4). These mounting screws may secure base 304 of the assembly to substrate 110 to ensure that the inner-workings and/or structure remain intact atop multi-chip 102.

Figure 7:
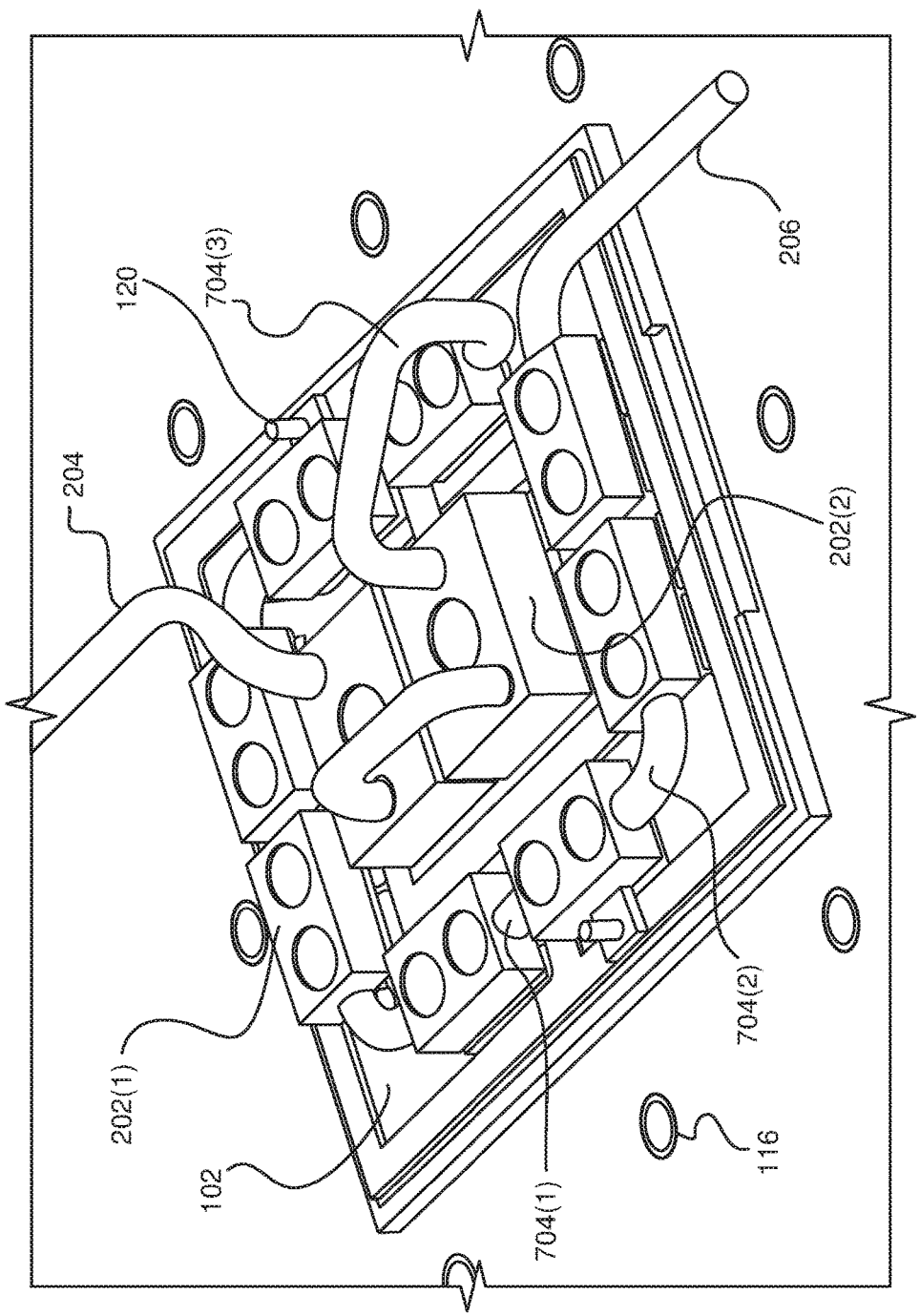
FIG. 7 is an illustration of an additional exemplary apparatus for cooling multi-chip modules via clustered fluid-cooled plates.
Figure 8:
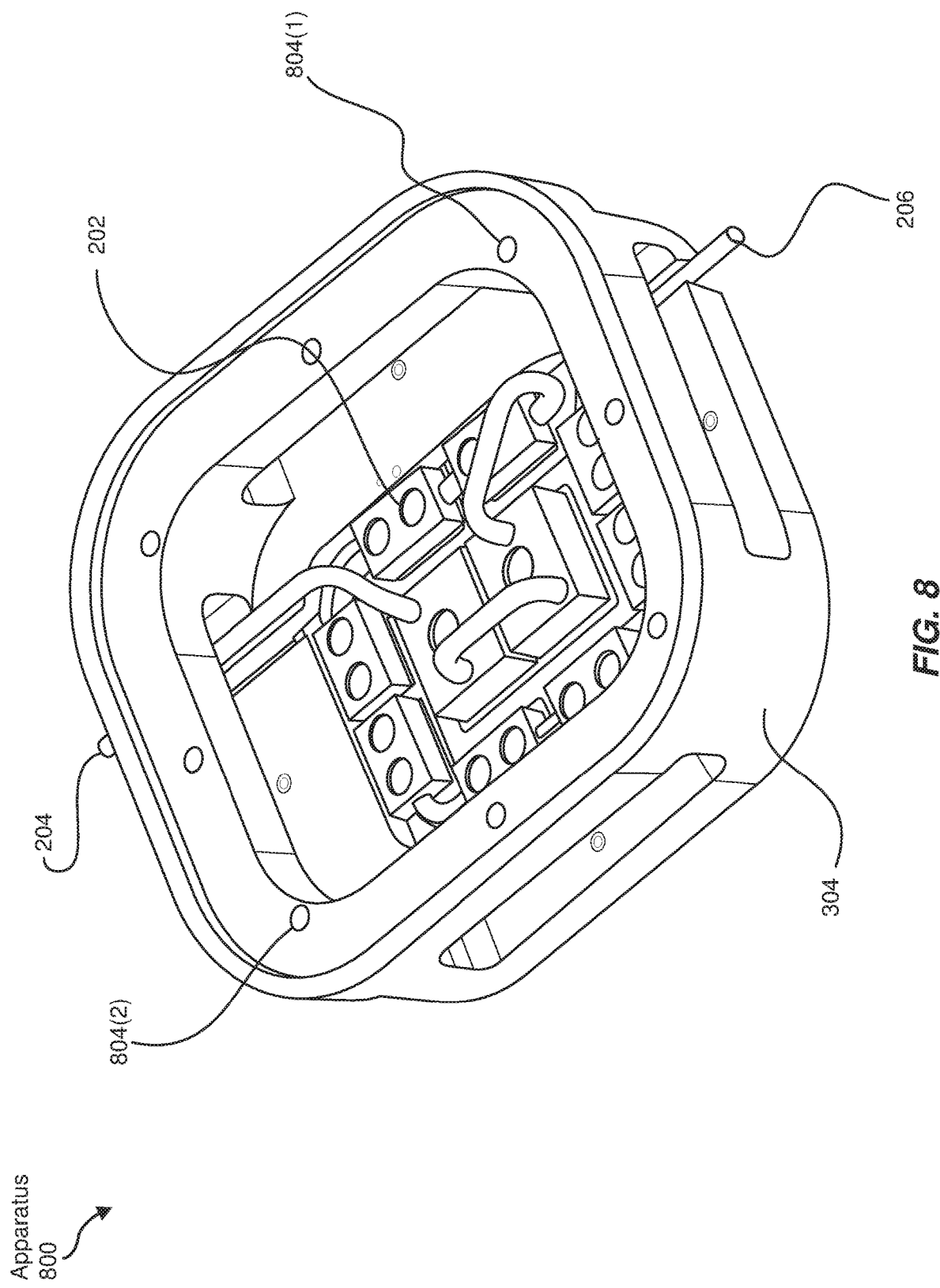
FIG. 8 is an illustration of an additional exemplary apparatus for cooling multi-chip modules via clustered fluid-cooled plates.

FIGS. 7 and 8 illustrate exemplary apparatuses 700 and 800, respectively, for cooling multi-chip module 102 via clustered fluid-cooled plates. As illustrated in FIG. 7, apparatus 700 may include and/or represent a daisy-chain configuration of clustered fluid-cooled plates that includes only one source conduit and only one return conduit. In some examples, this daisy-chain configuration may eliminate the need for a distributor manifold. As a result, the assembly that encloses and/or surrounds apparatus 700 may omit and/or exclude the distributor manifold illustrated in FIG. 5.

In this daisy-chain configuration, apparatus 700 may include source conduit 204, which introduces cooling fluid from the condenser to a fluid-cooled plate coupled to an electronic component located in the center of multi-chip module 102. In addition, apparatus 700 may include return conduit 206, which carries the cooling fluid from a fluid-cooled plate coupled to an electronic component located on the perimeter of multi-chip module 102 back toward the condenser.

As illustrated in FIG. 7, apparatus 700 may include one or more intermediate conduits, such as intermediate conduits 704(1), 704(2), and 704(3). In some examples, these intermediate conduits may have any of the same qualities and/or characteristics of the source and/or return conduits described above in connection with FIG. 2. In one example, these intermediate conduits may each operatively couple two fluid-cooled plates to one another. In this example, these intermediate conduits may feed and/or carry the cooling fluid across the various fluid-cooled plates from one to another.

Accordingly, this daisy-chain configuration may cause the cooling fluid to enter the fluid-cooled plates from the condenser and/or pump via source conduit 204. The cooling fluid may pass from one fluid-cooled plate to another via the various intermediate conduits. After passing through all of the fluid-cooled plates, the cooling fluid may exit the fluid-cooled plates and/or return to the condenser and/or pump via return conduit 206.

In some examples, the cooling fluid may traverse from the condenser to a first group of electronic components positioned in the center of multi-chip module 102 via source conduit 204. After passing through the first group of electronic components in the center, the cooling fluid may traverse from the first group of electronic components to a second group of electronic components positioned around the perimeter of multi-chip module 102 via at least one intermediate conduit. After passing through the second group of electronic components positioned along the perimeter, the cooling fluid may return to the condenser via return conduit 206.

As illustrated in FIG. 8, base 304 of the assembly may include and/or form one or more mounting holes, such as mounting holes 804(1) and 804(2). In one example, these mounting holes may enable base 304 to be secured and/or mechanically coupled to substrate 110 in a specific position atop multi-chip module 102. For example, mounting screws may interface with and/or pass through substrate 110 via these mounting holes to secure base 304 of the assembly in place.

Figure 9:
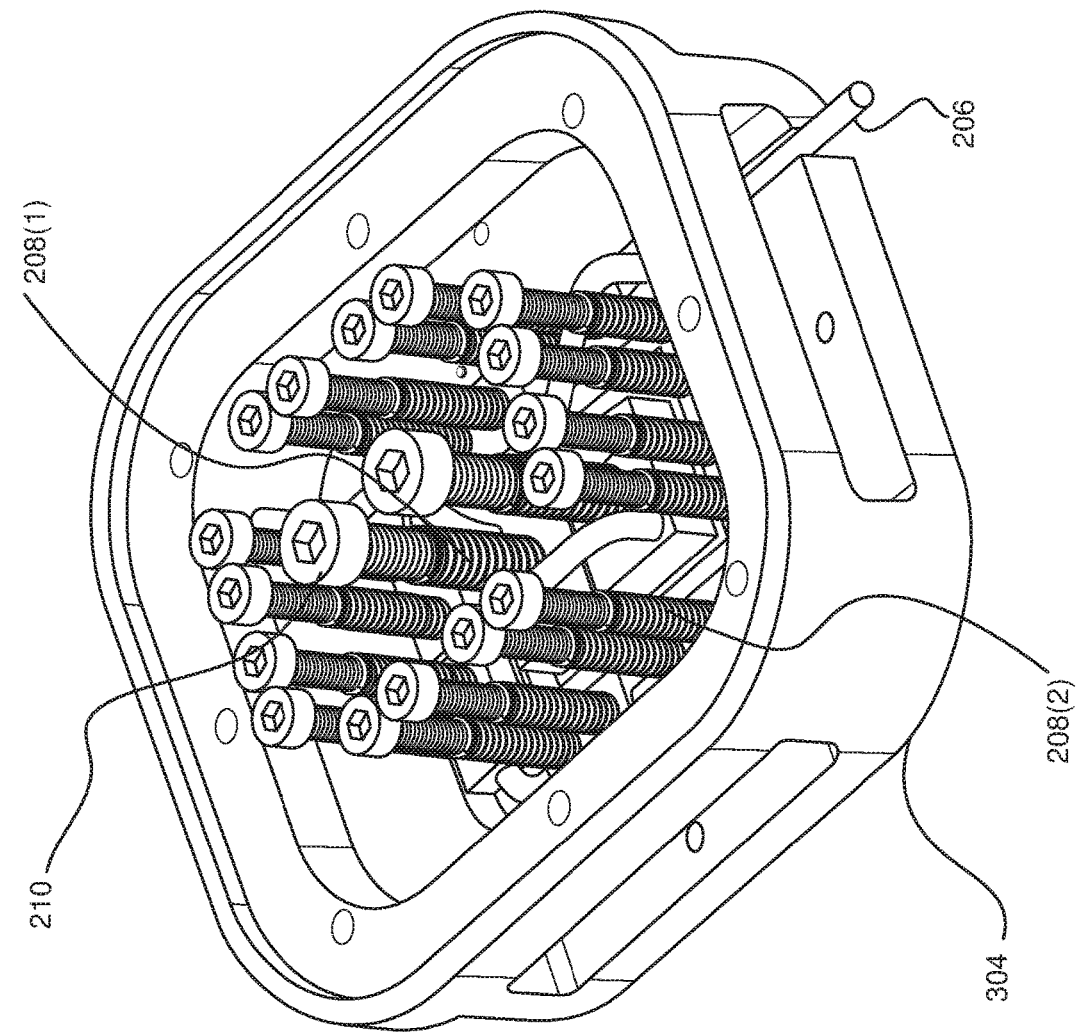
FIG. 9 is an illustration of an additional exemplary apparatus for cooling multi-chip modules via clustered fluid-cooled plates.

FIG. 9 illustrates an exemplary apparatus 900 for cooling multi-chip module 102 via clustered fluid-cooled plates. As illustrated in FIG. 9, apparatus 900 may include various coil springs placed atop the clustered fluid-cooled plates within base 304 of the assembly. In this example, apparatus 900 may also include various clamping screws that mate and/or interface with those coil springs via head 506 of the assembly (not illustrated in FIG. 9).

FIG. 9 may represent a diagonal view of apparatus 900 in which head 506 of the assembly is transparent, invisible, and/or missing. This view of apparatus 900 is merely exemplary and meant to illustrate the inner-workings and/or structure of apparatus 900 without obstruction by head 506 of the assembly.

Figure 10:
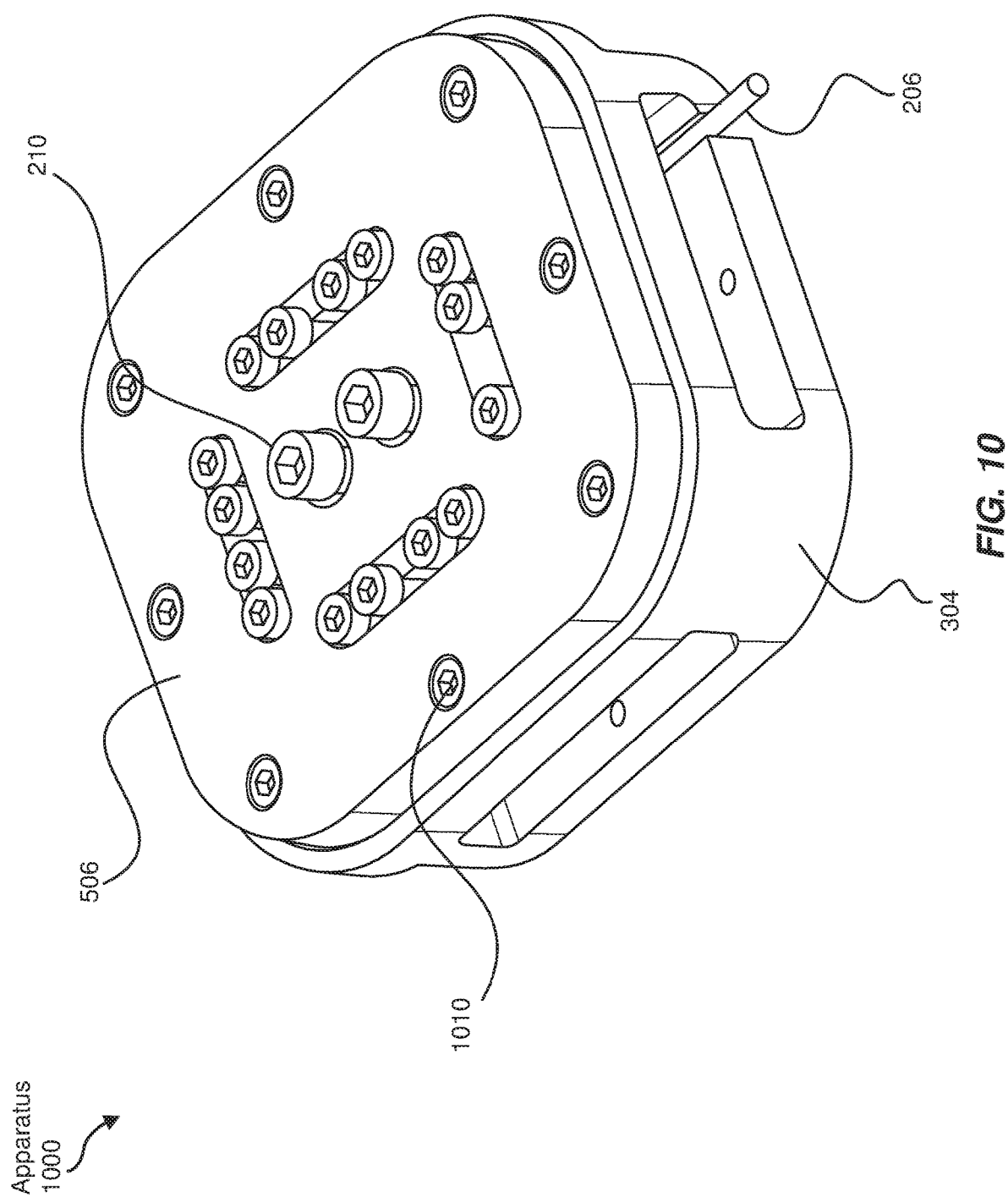
FIG. 10 is an illustration of an additional exemplary apparatus for cooling multi-chip modules via clustered fluid-cooled plates.

FIG. 10 illustrates an exemplary apparatus 1000 for cooling multi-chip module 102 via clustered fluid-cooled plates. As illustrated in FIG. 10, apparatus 1000 may include head 506 of the assembly mated with and/or attached to base 304 of the assembly. In this example, apparatus 1000 may also include one or more mounting screws, such as mounting screw 1010. In one example, these mounting screws may secure base 304 and/or head 506 to one another to form a complete assembly. Additionally or alternatively, these mounting screws may secure base 304 and/or head 506 to substrate 110 atop multi-chip module 102.

Figure 11:
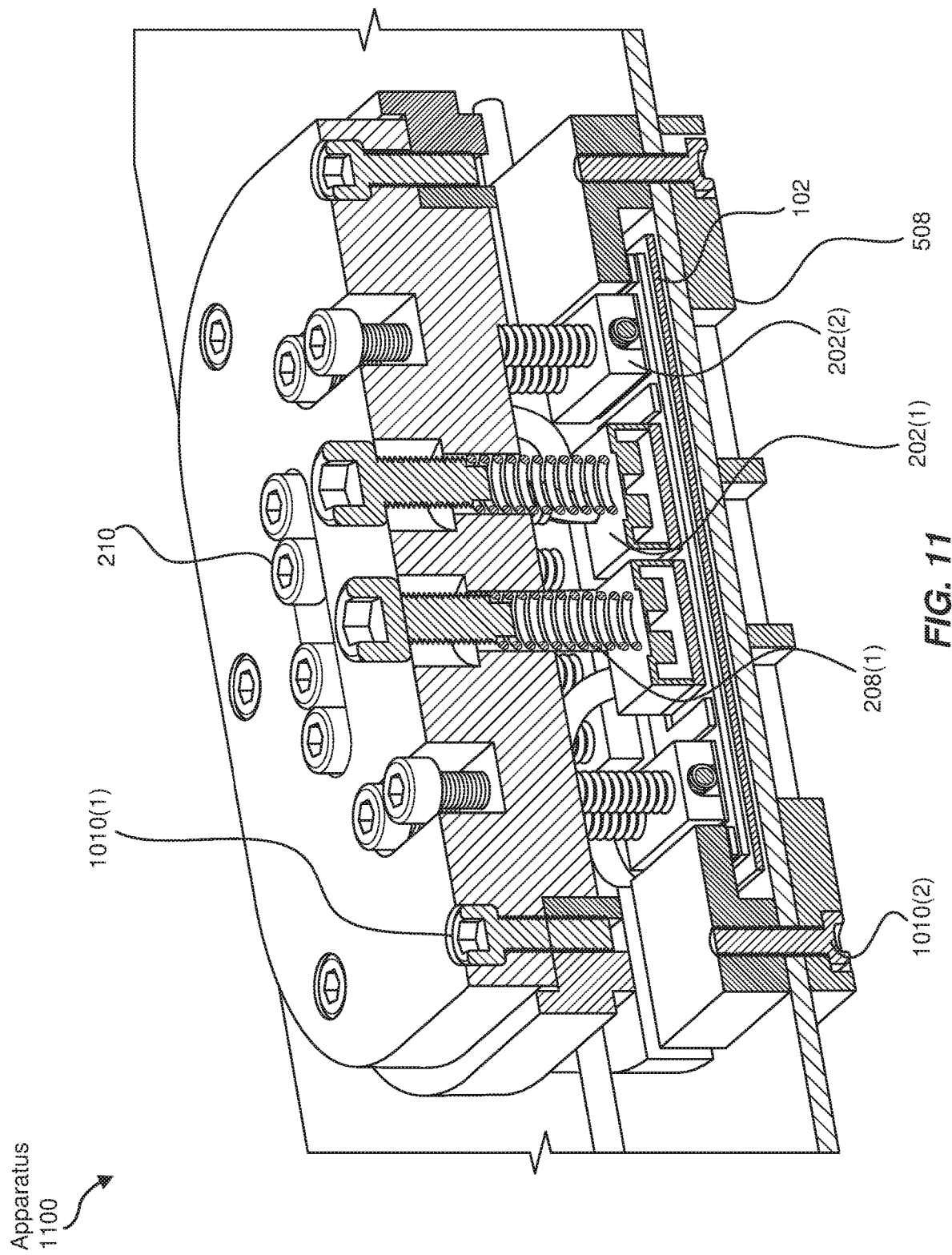
FIG. 11 is a cross-section illustration of an additional exemplary apparatus for cooling multi-chip modules via clustered fluid-cooled plates.

FIG. 11 illustrates a cross section of an exemplary apparatus 1100 for cooling multi-chip module 102 via clustered fluid-cooled plates. As illustrated in FIG. 11, head 506 of the assembly may be mated and/or attached to base 304 of the assembly by one or more mounting screws, such as mounting screw 1010(1). In addition, base 304 of the assembly may be secured and/or coupled to substrate 110 by one or more mounting screws, such as mounting screw 1010(2). In one example, the mounting screws that secure and/or couple base 304 to substrate 110 may be inserted from a bottom side of substrate 110 opposite multi-chip module 102.

As illustrated in FIG. 11, base 304 and/or head 506 may be secured and/or coupled to back plate 508, which provides support and/or additional structure to multi-chip module 102 and/or the assembly. In one example, base 304 and/or head 506 may be applied to a top side of substrate 110 along with multi-chip module 102, and back plate 508 may be applied to the bottom side of substrate 110. In this example, back plate 508 may be attached to base 304 by mounting screws inserted through substrate 110 from the bottom side.

Figure 12:
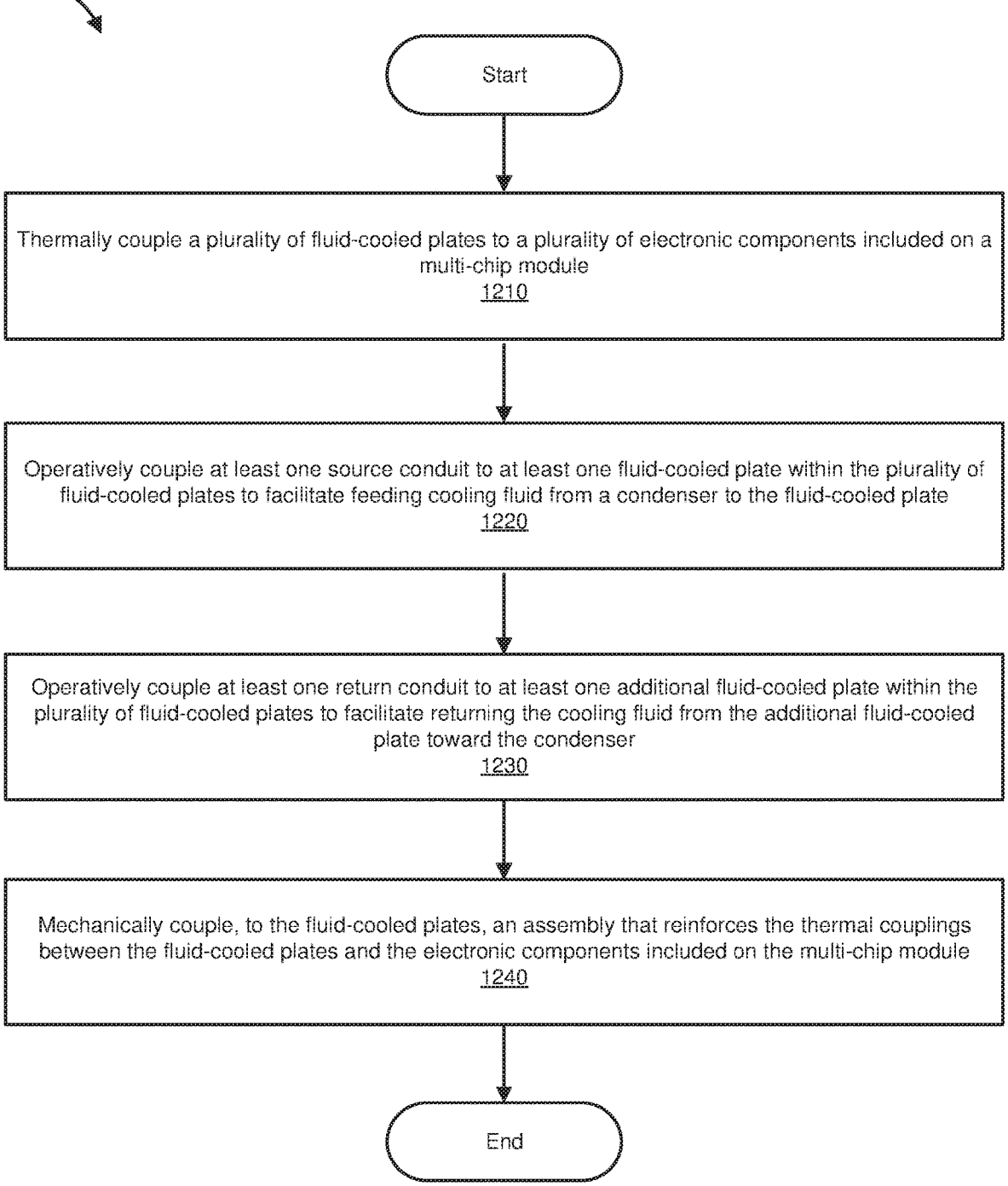
FIG. 12 is a flow diagram of an exemplary method for cooling multi-chip modules via clustered fluid-cooled plates.

FIG. 12 is a flow diagram of an exemplary method 1200 for cooling multi-chip modules via clustered fluid-cooled plates. Method 1200 may include the step of thermally coupling a plurality of fluid-cooled plates to a plurality of electronic components included on a multi-chip module (1210). Step 1210 may be performed in a variety of ways, including any of those described above in connection with FIGS. 1-11. For example, a computing equipment manufacturer or subcontractor may apply a set of fluid-cooled plates to a set of electronic components included on multi-chip module 102. By doing so, the computing equipment manufacturer or subcontractor may form thermal couplings between these fluid-cooled plates and the electronic components.

As illustrated in FIG. 12, method 1200 may also include the step of operatively coupling at least one source conduit to at least one fluid-cooled plate within the plurality of fluid-cooled plates to facilitate feeding cooling fluid from a condenser to the fluid-cooled plate (1220). Step 1220 may be performed in a variety of ways, including any of those described above in connection with FIGS. 1-11. For example, the computing equipment manufacturer or subcontractor may fuse a source conduit to one of the fluid-cooled plates. Additionally or alternatively, the computing equipment manufacturer or subcontractor may create a device and/or mechanism that includes both the source conduit and the fluid-cooled plate fused together as a single unit.

As illustrated in FIG. 12, method 1200 may also include the step of operatively coupling at least one return conduit to at least one additional fluid-cooled plate within the plurality of fluid-cooled plates to facilitate returning the cooling fluid from the additional fluid-cooled plate toward the condenser (1230). Step 1230 may be performed in a variety of ways, including any of those described above in connection with FIGS. 1-11. For example, the computing equipment manufacturer or subcontractor may fuse a return conduit to another one of the fluid-cooled plates. Additionally or alternatively, the computing equipment manufacturer or subcontractor may manufacture and/or create a device and/or mechanism that includes both the return conduit and the other fluid-cooled plate fused together as a single unit.

As illustrated in FIG. 12, method 1200 may also include the step of mechanically coupling, to the fluid-cooled plates, a spring-loaded assembly that reinforces the thermal couplings between the fluid-cooled plates and the electronic components included on the multi-chip module (1240). Step 1240 may be performed in a variety of ways, including any of those described above in connection with FIGS. 1-11. For example, the computing equipment manufacturer or subcontractor may design and/or construct a spring-loaded assembly for applying individual forces and/or loads to the fluid-cooled plates. Additionally or alternatively, the computing equipment manufacturer or subcontractor may mechanically couple the spring-loaded assembly to the fluid-cooled plate to reinforce the thermal couplings between the fluid-cooled plates and the electronic components included on multi-chip module 102.

As described above in connection with FIGS. 1-12, embodiments of the instant disclosure may provide a spring-loaded assembly of coolers designed to cool a high power density multi-chip module based opto-switch. In one example, this spring-loaded assembly may be able to compensate for non-coplanarity and/or warpage of the multi-chip module via individual compact coolers. In this example, the coolers may be applied vertically to the multi-chip module and/or include flexible lines that integrate the coolers into a fluid-cooled loop.

In one example, this spring-loaded assembly may ensure the best possible intimate connection between the coolers and the multi-chip module. This spring-loaded assembly may also address and/or compensate for any deformations of the substrate and/or socket of the multi-chip module. In addition, the spring-loaded assembly may include multiple individual springs that facilitate individually tuning the deflections in the multi-chip module and/or socket joint.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
a plurality of fluid-cooled plates that thermally couple to a plurality of electronic components included on a multi-chip module;
at least one source conduit that:
is operatively coupled to at least one fluid-cooled plate within the plurality of fluid-cooled plates; and
feeds cooling fluid from a condenser to the fluid-cooled plate;
at least one return conduit that:
is operatively coupled to at least one additional fluid-cooled plate within the plurality of fluid-cooled plates; and
returns the cooling fluid from the additional fluid-cooled plate toward the condenser; and
an assembly that:
is mechanically coupled to the fluid-cooled plates; and
reinforces the thermal couplings between the fluid-cooled plates and the electronic components included on the multi-chip module;
an intermediate conduit that:
operatively couples the fluid-cooled plate and the additional fluid-cooled plate; and
feeds the cooling fluid from the fluid-cooled plate to the additional fluid-cooled plate; and
wherein:
the fluid-cooled plate sits atop a first group of the electronic components positioned in a center of the multi-chip module;
the additional fluid-cooled plate sits atop a second group of the electronic components positioned around a perimeter of the multi-chip module; and
the multi-chip module is mechanically coupled to a substrate that includes a plurality of alignment pins that facilitate aligning the assembly atop the multi-chip module such that the fluid-cooled plates thermally couple with the electronic components.

2. The apparatus of claim 1, further comprising:
a plurality of coil springs placed atop the fluid-cooled plates; and
a plurality of screws; and
wherein the assembly comprises a spring-loaded clamping system that:
presses against the coil springs placed atop the fluid-cooled plates; and
includes a plurality of screw holes through which the screws mate with the coil springs.

3. The apparatus of claim 2, wherein the assembly:
is mechanically coupled to the substrate around the multi-chip module; and
at least partially covers the multi-chip module.

4. The apparatus of claim 3, wherein the assembly, when mechanically coupled to the substrate, compresses the coil springs against the fluid-cooled plates to reinforce the thermal couplings between the fluid-cooled plates and the electronic components.

5. The apparatus of claim 3, wherein the substrate comprises at least one of:
a socket for the multi-chip module;
a circuit board to which the multi-chip module is electrically coupled;
a stiffening brace that mitigates warpage of the multi-chip module during production; and
a back plate that provides support to the multi-chip module.

6. The apparatus of claim 2, wherein:
the coil springs abut the screws; and
the screws provide resistance to the coil springs that cause the coil springs to apply force to the fluid-cooled plates.

7. The apparatus of claim 1, wherein:
the electronic components included on the multi-chip module are coplanar with one another; and
the fluid-cooled plates sit coplanar to one another atop the electronic components included on the multi-chip module.

8. The apparatus of claim 1, wherein a plurality of thermal interface materials that reside between the fluid-cooled plates and the electronic components.

9. The apparatus of claim 1, further comprising:
a plurality of intermediate conduits that:
operatively couple the fluid-cooled plates to one another in a daisy-chain configuration; and
feed the cooling fluid across the fluid-cooled plates from one to another such that:
the source conduit feeds the cooling fluid from the condenser to the fluid-cooled plate;
the intermediate conduits feed the cooling fluid from the fluid-cooled plate to one or more intermediate fluid-cooled plates within the plurality of fluid-cooled plates; and
the return conduit returns the cooling fluid from the additional fluid-cooled plate to the condenser.

10. A system comprising:
a multi-chip module that includes a plurality of electronic components;
a plurality of fluid-cooled plates that thermally couple to the electronic components included on the multi-chip module;
at least one source conduit that:
is operatively coupled to at least one fluid-cooled plate within the plurality of fluid-cooled plates; and
feeds cooling fluid from a condenser to the fluid-cooled plate;
at least one return conduit that:
is operatively coupled to at least one additional fluid-cooled plate within the plurality of fluid-cooled plates; and
returns the cooling fluid from the additional fluid-cooled plate toward the condenser; and
an assembly that:
is mechanically coupled to the fluid-cooled plates; and
reinforces the thermal couplings between the fluid-cooled plates and the electronic components included on the multi-chip module;
an intermediate conduit that:
operatively couples the fluid-cooled plate and the additional fluid-cooled plate; and
feeds the cooling fluid from the fluid-cooled plate to the additional fluid-cooled plate; and wherein:
the fluid-cooled plate sits atop a first group of the electronic components positioned in a center of the multi-chip module;
the additional fluid-cooled plate sits atop a second group of the electronic components positioned around a perimeter of the multi-chip module; and
the multi-chip module is mechanically coupled to a substrate that includes a plurality of alignment pins that facilitate aligning the assembly atop the multi-chip module such that the fluid-cooled plates thermally couple with the electronic components.

11. The system of claim 10, further comprising:
a plurality of coil springs placed vertically atop the fluid-cooled plates; and
a plurality of screws; and
wherein the assembly comprises a spring-loaded clamping system that:
presses against the coil springs placed vertically atop the fluid-cooled plates; and
includes a plurality of screw holes through which the screws mate with the coil springs.

12. The system of claim 11, wherein the assembly:
is mechanically coupled to the substrate around the multi-chip module; and
at least partially covers the multi-chip module.

13. The system of claim 12, wherein the assembly, when mechanically coupled to the substrate, compresses the coil springs against the fluid-cooled plates to reinforce the thermal couplings between the fluid-cooled plates and the electronic components.

14. The system of claim 13, wherein the substrate comprises at least one of:
a socket for the multi-chip module;
a circuit board to which the multi-chip module is electrically coupled;
a stiffening brace that mitigates warpage of the multi-chip module during production; and
a back plate that provides support to the multi-chip module.

15. The system of claim 11, wherein:
the coil springs abut against the screws; and
the screws provide resistance to the coil springs that cause the coil springs to apply force to the fluid-cooled plates.

16. The system of claim 10, wherein:
the electronic components included on the multi-chip module are coplanar with one another; and
the fluid-cooled plates sit coplanar to one another atop the electronic components included on the multi-chip module.

17. The system of claim 10, wherein a plurality of thermal interface materials that reside between the fluid-cooled plates and the electronic components.

18. A method comprising:
thermally coupling a plurality of fluid-cooled plates to a plurality of electronic components included on a multi-chip module;
operatively coupling at least one source conduit to at least one fluid-cooled plate within the plurality of fluid-cooled plates to facilitate feeding cooling fluid from a condenser to the fluid-cooled plate;
operatively coupling at least one return conduit to at least one additional fluid-cooled plate within the plurality of fluid-cooled plates to facilitate returning the cooling fluid from the additional fluid-cooled plate toward the condenser;
mechanically coupling, to the fluid-cooled plates, an assembly that reinforces the thermal couplings between the fluid-cooled plates and the electronic components included on the multi-chip module; and
operatively coupling the fluid-cooled plate and the additional fluid-cooled plate to one another via an intermediate conduit that feeds the cooling fluid from the fluid-cooled plate to the additional fluid-cooled plate, wherein:
the fluid-cooled plate sits atop a first group of the electronic components positioned in a center of the multi-chip module;
the additional fluid-cooled plate sits atop a second group of the electronic components positioned around a perimeter of the multi-chip module; and
the multi-chip module is mechanically coupled to a substrate that includes a plurality of alignment pins that facilitate aligning the assembly atop the multi-chip module such that the fluid-cooled plates thermally couple with the electronic components.

\* \* \* \* \*